United States Patent
Tanimoto et al.

(10) Patent No.: US 8,896,111 B2
(45) Date of Patent: Nov. 25, 2014

(54) SEMICONDUCTOR DEVICE AND METHOD FOR MANUFACTURING THE SAME

(71) Applicant: Kabushiki Kaisha Toshiba, Tokyo (JP)

(72) Inventors: Akira Tanimoto, Yokohama (JP); Takashi Imoto, Yokkaichi (JP); Yoriyasu Ando, Yokkaichi (JP); Masashi Noda, Ichinomiya (JP); Naoki Iwamasa, Yokkaichi (JP); Koichi Miyashita, Yokkaichi (JP); Masatoshi Kawato, Kameyama (JP); Masaji Iwamoto, Yokohama (JP); Jun Tanaka, Yokkaichi (JP); Yusuke Dohmae, Mie-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/795,297

(22) Filed: Mar. 12, 2013

(65) Prior Publication Data

US 2014/0070428 A1    Mar. 13, 2014

(30) Foreign Application Priority Data

Sep. 10, 2012  (JP) ................. 2012-198367

(51) Int. Cl.
*H01L 23/02*   (2006.01)
*H01L 21/00*   (2006.01)
*H01L 23/488*  (2006.01)
*H01L 21/50*   (2006.01)
*H01L 23/31*   (2006.01)

(52) U.S. Cl.
CPC ..... *H01L 23/488* (2013.01); *H01L 2224/45147* (2013.01); *H01L 2224/92247* (2013.01); *H01L 2224/45144* (2013.01); *H01L 2225/06506* (2013.01); *H01L 2924/3511* (2013.01); *H01L 2224/73265* (2013.01); *H01L 2224/32225* (2013.01); *H01L 21/50* (2013.01); *H01L 23/3128* (2013.01); *H01L 2225/0651* (2013.01); *H01L 2225/06562* (2013.01); *H01L 2224/48145* (2013.01); *H01L 2224/32145* (2013.01); *H01L 2924/15311* (2013.01); *H01L 2224/48227* (2013.01)

USPC ............ 257/686; 257/E25.006; 257/E25.021; 257/E25.027; 257/E23.085; 438/109

(58) Field of Classification Search
USPC .................. 257/686, 777, E25.006, E25.013, 257/E25.021, E25.027, E23.085; 438/109, 438/FOR. 368, FOR. 426

See application file for complete search history.

(56) References Cited

U.S. PATENT DOCUMENTS

2007/0222051 A1   9/2007  Yoshimura et al.
2013/0062758 A1*  3/2013  Imoto et al. .................. 257/737

FOREIGN PATENT DOCUMENTS

JP       2007-324443       12/2007

\* cited by examiner

*Primary Examiner* — Jasmine Clark

(74) *Attorney, Agent, or Firm* — Oblon, Spivak, McClelland, Maier & Neustadt, L.L.P.

(57) ABSTRACT

In one embodiment, a semiconductor device includes a first semiconductor chip disposed on a circuit board, an adhesive layer fixing the first semiconductor chip to the circuit board, and a second semiconductor chip having an outer shape smaller than that of the first semiconductor chip. At least a part of the second semiconductor chip is embedded in the adhesive layer. The adhesive layer has a thickness in a range of 95 to 150 µm. The adhesive layer includes a cured product of a thermosetting resin whose thermal time viscosity at a time that the second semiconductor chip is embedded is in a range of 500 to 5000 Pa·s.

13 Claims, 6 Drawing Sheets

SEMICONDUCTOR DEVICE AND METHOD FOR MANUFACTURING THE SAME

CROSS REFERENCE TO RELATED APPLICATION

This application is based upon and claims the benefit of priority from the prior Japanese Patent Application No. 2012-198367, filed on Sep. 10, 2012; the entire contents of which are incorporated herein by reference.

FIELD

Embodiments described herein relate generally to a semiconductor device and a method for manufacturing the same.

BACKGROUND

In order to realize downsizing, speed-up, sophistication, and so on of a semiconductor device, a semiconductor device with a SiP (System in Package) structure where a plurality of semiconductor chips are stacked and sealed in one package is in practical use. The semiconductor device with the SiP structure has, for example, a wiring board, semiconductor chips such as a memory chip mounted and a controller chip on the wiring board, and a sealing resin layer sealing such semiconductor chips collectively. It is general that a system LSI chip such as a controller chip, whose outer shape is smaller than that of the memory chip, is disposed on a chip stacked body made by stacking memory chips in multistage. In such a case, since a wiring length from the wiring board to the system LSI chip is long, deterioration or the like of a signal transfer rate is concerned.

In order to cope with the above, it is proposed to embed a system LSI chip in an adhesive layer bonding a memory chip to a wiring board. According to such a structure, a semiconductor device can be down-sized and a wiring length from the wiring board to the system LSI chip can be shortened. Therefore, it becomes possible to provide a semiconductor device which is small in size and can cope with a high-speed device. However, in embedding the system LSI chip in the adhesive layer of the memory chip, occurrence of various problems is concerned. For example, there is an apprehension that the memory chip is deformed into a convex shape when the system LSI chip is embedded in the adhesive layer, or that a void is generated due to insufficient embedding of the system LSI chip. A deformation of the memory chip causes an operation failure. The void generated in a circumference of the system LSI chip causes occurrence of a crack or the like.

DETAILED DESCRIPTION

According to one embodiment, a semiconductor device includes a circuit board, a first semiconductor chip disposed on the circuit board, an adhesive layer fixing the first semiconductor chip to the circuit board, a second semiconductor chip, at least a part of which is embedded in the adhesive layer, having an outer shape smaller than that of the first semiconductor chip, a first connecting member electrically connecting the circuit board and the first semiconductor chip, a second connecting member electrically connecting the circuit board and the second semiconductor chip, and a sealing resin layer provided on the circuit board to seal the first and second semiconductor chips with the first and second connecting members. The second semiconductor chip has a thickness of 75 μm or less. The adhesive layer has a thickness in a range of 95 to 150 μm, and contains a cured product of a thermosetting resin whose thermal time viscosity at a time that the second semiconductor chip is embedded is in a range of 500 to 5000 Pa·s.

Figure 1:
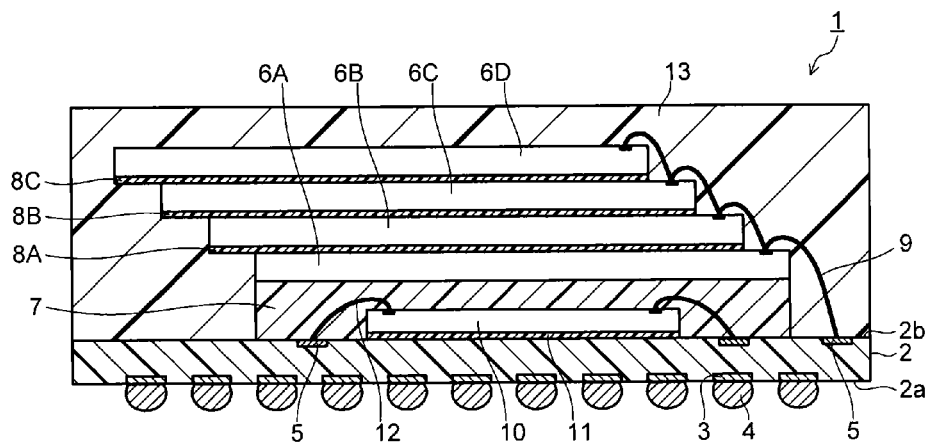
FIG. 1 is a cross-sectional view showing a semiconductor device according to an embodiment.

Hereinafter, a semiconductor device of the embodiment and a method for manufacturing the same will be described with reference to the drawings. FIG. 1 is a cross-sectional view showing a semiconductor device according the embodiment. A semiconductor device 1 shown in FIG. 1 includes a wiring board 2 as a circuit board. The wiring board 2 is, for example, an insulating resin substrate, a ceramic substrate or the like having a wiring network (not shown) on a surface thereof and/or inside thereof. Concretely, there is cited a print wiring board in which an insulating resin such as a glass-epoxy resin is used. As the circuit board, a silicon interposer or the like can be used instead of the wiring board (interposer board) 2. The wiring board 2 has a first surface 2a to be a surface on which an external terminal is formed and a second surface 2b to be a mounting surface for a semiconductor chip.

The first surface 2a of the wiring board 2 has external electrodes 3. External terminals 4 are formed on the external electrodes 3. When the semiconductor device 1 is used as a BGA package, the external terminals 4 are constituted by a projecting terminal in which a solder ball or solder plating is used. When the semiconductor device 1 is used as an LGA package, metal lands in which Au plating or the like is used are applied as the external terminals 4. The second surface 2b to be the mounting surface of the semiconductor chip of the wiring board 2 has internal electrodes 5. At least part of the internal electrodes 5 is electrically connected to the external terminal 4 via the wiring network and the external electrode 3 of the wiring board 2.

A plurality of first semiconductor chips 6 (6A to 6D) is disposed on the second surface 2b of the wiring board 2. The first semiconductor chips 6A to 6D are stacked stepwise so that each of electrode pads thereof is exposed. As a concrete example of the first semiconductor chip 6, a semiconductor memory chip such as a NAND type flash memory is cited, but the first semiconductor chip 6 is not limited to the above. FIG. 1 shows a structure in which four first semiconductor chips 6A to 6D are stacked, but the number of the first semiconductor chips 6 mounted on the wiring board 2 is not limited to the above. The number of the mounted first semiconductor chips can be one or plural. A thickness of the first semiconductor chip 6 is different depending on manufacturing steps thereof, but is 90 µm or more, for example. Semiconductor chips 6 having different thicknesses can be used in correspondence with positions of arrangement.

Among the plural first semiconductor chips 6A to 6D, the first semiconductor chip 6A positioned at a lowest is fixed to the second surface 2b of the wiring board 2 via a first adhesive layer 7. The first adhesive layer 7 is made to intervene between the second surface 2b of the wiring board 2 and the first semiconductor chip 6A and is bonded to the second surface 2b of the wiring board 2. The first semiconductor chips 6B to 6D of a second to a fourth are bonded in sequence on the first semiconductor chip 6A positioned at the lowest, via second adhesive layers 8A to 8C. The electrode pads of the first semiconductor chips 6A to 6D are each exposed toward upward by being displaced stepwise and stacked.

The electrode pads of the first semiconductor chips 6A to 6D are electrically connected to the internal electrode 5 of the wiring board 2 via a first bonding wire 9. In regard to the electrode pads with electric properties or signal properties equal to each other, the internal electrode 5 of the wiring board 2 and the electrode pads of the first semiconductor chips 6A to 6D can be connected in sequence by the first connecting wire 9. As the first bonding wire 9, a common metal wire such as an Au wire or a Cu wire is used. The above also applies to a second bonding wire described later. The first bonding wire 9 functions as a first connecting member electrically connecting the electrode pads of the first semiconductor chips 6A to 6D and the internal electrode 5 of the wiring board 2.

The first connecting member is not limited to the bonding wire, but can be a wiring layer (conductive layer) formed by ink-jet printing or the like. Electrical connection among the plural first semiconductor chips 6A to 6D can be done via through electrodes which are provided inside the first semiconductor chips 6 and bump electrodes. In such a case, the plural first semiconductor chips 6A to 6D are mechanically and electrically connected via the through electrodes and the bump electrodes. Further, any one of the first semiconductor chips 6, for example, the first semiconductor chip 6D positioned at a highest and the internal electrode 5 of the wiring board 2 are electrically connected via the bonding wire.

On the second surface 2b of the wiring board 2, a second semiconductor chip 10 having a outer shape (size) smaller than that of the first semiconductor chips 6 is further disposed in a manner to be positioned at the downside of the first semiconductor chip 6. In other words, the second semiconductor chip 10 is bonded to the second surface 2b of the wiring board 2 via a third adhesive layer 11, and is further embedded in the first adhesive layer 7 fixing the first semiconductor chip 6A positioned at the lowest to the wiring board 2. An electrode pad of the second semiconductor chip 10 is electrically connected to the internal electrode 5 of the wiring board 2 via a second bonding wire 12. A second connecting member to electrically connect the second semiconductor chip 10 and the wiring board 2 is not limited to the bonding wire 12, but can be a bump electrode or the like.

As the second semiconductor chip 10, there is cited a system LSI chip such as a controller chip or an interface chip transmitting/receiving a digital signal between the memory chip being the first semiconductor chip 6 and an external device, a logic chip, and an RF chip, but the second semiconductor chip 10 is not limited thereto. By mounting the second semiconductor chip on the second surface 2b of the wiring board 2, a wiring length from the second semiconductor chip 10 such as a system LSI chip to the wiring board 2 can be shortened, which enables optimization of substrate wiring. Thereby, response to speed-up of the semiconductor device 1 becomes possible. Further, since the second semiconductor chip 10 is embedded in the first adhesive layer 7, the second semiconductor chip 10 does not deteriorate mountability of the first semiconductor chips 6A to 6D on the wiring board 2, nor prevent down-sizing or the like of a device size. Therefore, it is possible to provide the semiconductor 1 which is small in size and can cope with a high-speed device.

Figure 2:
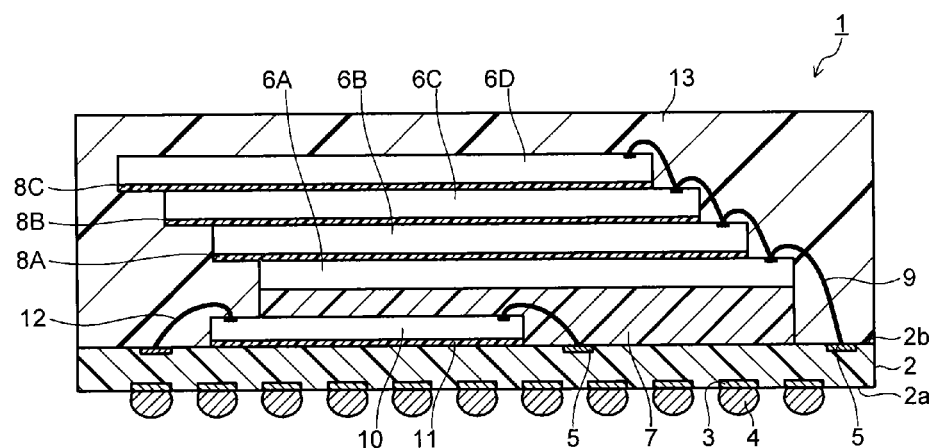
FIG. 2 is a cross-sectional view showing a first modification example of the semiconductor device shown in FIG. 1.

On the second surface 2b of the wiring board 2, a sealing resin layer 13 using an insulating resin such as an epoxy resin is formed, for example, by molding, in a manner to seal the first semiconductor chip 6 and the second semiconductor chip 10 together with the bonding wires 9, 12. The semiconductor device 1 of the embodiment is constituted by those components. FIG. 1 shows a structure in which the whole of the second semiconductor chip 10 is embedded in the first adhesive layer 7. An embedding structure of the second semiconductor chip 10 in the first adhesive layer 7 is not limited thereto. As shown in FIG. 2, it is also possible to apply a structure in which only a part of the second semiconductor chip 10 is embedded in the first adhesive layer 7. Also thereby, shortening of the wiring length and down-sizing of the device size can be realized. At least a part of the second semiconductor chip 10 is embedded in the first adhesive layer 7.

Figure 3:
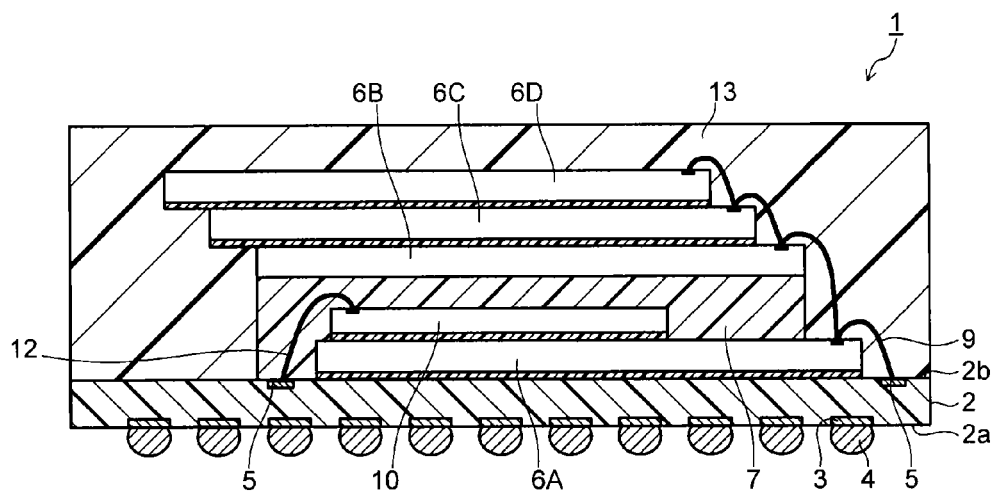
FIG. 3 is a cross-sectional view showing a second modification example of the semiconductor device shown in FIG. 1.

A structure of disposition of the second semiconductor chip 10 is not limited to the structure in which the second semiconductor chip 10 is disposed on the second surface 2b of the wiring board 2, but the second semiconductor chip 10 can be disposed on another semiconductor chip within a scope where the wiring length from the second semiconductor chip 10 to the wiring board 2 does not adversely affect a signal transfer rate. FIG. 3 shows a structure in which a first semiconductor chip 6A of a first is disposed on a second surface 2b of a wiring board 2 and a second semiconductor chip 10 is disposed thereon. The second semiconductor chip 10 is embedded in an adhesive layer 7 fixing a first semiconductor chip 6B of a second to the wiring board 2. The adhesive layer 7 in which the second semiconductor chip 10 is embedded is not limited to an adhesive layer bonding the first semiconductor chip 6 to the wiring board 2 directly, but can be an adhesive layer bonding the first semiconductor chip 6 to the wiring board 2 via another semiconductor chip. The second semiconductor chip 10 is embedded in the adhesive layer 7 fixing the first semiconductor chip 6 to the wiring board 2.

For embedding the second semiconductor chip 10 in the adhesive layer 7, the second semiconductor chip 10 has a thickness of 75 µm or less. When the thickness of the second semiconductor chip 10 exceeds 75 µm, it is not possible to embed the second semiconductor chip 10 in the adhesive layer 7 satisfactorily even if a property of the adhesive forming the adhesive layer 7 is improved. A lower limit value of the thickness of the second semiconductor chip 10 is not limited in particular, but is generally 20 µm or more. Further, in order to embed the second semiconductor chip 10 with a thickness of 75 µM or more satisfactorily, the adhesive layer 7 has a thickness of 95 µm or more. When the thickness of the adhesive layer 7 is less than 95 µm, the bonding wire 12 electrically connecting the second semiconductor chip 10 and the wiring board 2 come into contact with the first semiconductor chip 6, or an insulation tolerance or the like between the second semiconductor chip 10 and the first semiconductor chip 6 is reduced.

In other words, by applying the adhesive layer 7 with the thickness of 95 µm or more, it is possible to embed the second semiconductor chip 10 in the adhesive layer 7 while maintaining an operation and a reliability of the second semiconductor chip 7. When only embedding of the second semiconductor chip 10 in the adhesive layer 7 is considered, increasing the thickness of the adhesive layer 7 improves an embedding capability of the second semiconductor chip 10. However, if the thickness of the adhesive layer 7 is made too thick, down-sizing and thinning of the semiconductor device 1 is hampered. Thickness of the adhesive layer 7 is 150 μm or less. The semiconductor device 1 of the embodiment has an adhesive layer 7 having a thickness in a range of 95 to 150 μm, and the embedding capability of the second semiconductor chip 10 is heightened by such an adhesive layer 7.

When a thick adhesive layer 7 with a thickness of 95 μm or more is applied, there is an apprehension that the first semiconductor chip 6 is deformed in a manner to be swollen in a convex shape or that a void occurs around the second semiconductor chip 10, depending on a hardness or the like at a time that the second semiconductor chip 10 is embedded in an adhesive forming the adhesive layer 7. In this embodiment, applied as the adhesive to be a forming material of the adhesive layer 7 is a thermosetting resin whose thermal time viscosity at a time that the second semiconductor chip 10 is embedded is in a range of 500 to 5000 Pa·s. The adhesive layer 7 includes a cured product of the thermosetting resin having the thermal time viscosity in the range of 500 to 5000 Pa·s. The thermal time viscosity indicates a viscosity at a temperature at which a thermosetting resin is softened or melted to exhibit adhesiveness when the thermosetting resin in a half-cured state is heated. The temperature at which the thermosetting resin is softened or melted is determined by a material property of the thermosetting resin constituting an adhesive or by a forming condition of an adhesive layer, for example, by a drying temperature, a drying time and so on at a time of making a resin composition in a liquid state (stage A) into that in a half-cured state (stage B).

Using the thermosetting resin whose thermal time viscosity is 5000 Pa·s or less as an adhesive improves flowability of the adhesive at the time of embedding the second semiconductor chip 10. Therefore, the adhesive flows and spreads satisfactorily on the second semiconductor chip 10, which suppresses occurrence of a convex-shaped deformation of the first semiconductor chip 6 due to a hardness of the adhesive and an operational failure based thereon. Further, by making the adhesive flow satisfactorily, the adhesive sufficiently reaches a surround of the second semiconductor chip 10. It is possible to suppress a void occurring in the surrounding area of the second semiconductor chip 10 and a crack due thereto. However, if the thermal time viscosity of the adhesive is too low, parallelism of the first semiconductor chip 6 in relation to the circuit board 2 is reduced, or an interval between the first semiconductor chip 6 and the second semiconductor chip 10 cannot be maintained. The thermal time viscosity of the adhesive is 500 Pa·s or more.

As the thermosetting resin used for the adhesive, an epoxy resin, a polyimide resin, an acrylic resin, a phenol resin and so on are cited. As the adhesive, it is possible to use, similarly to a general thermosetting adhesive, a thermosetting resin composition which contains a curing agent, an accelerator, an inorganic filler, various additives, a solvent and so on. By adjusting a kind and an added amount of a viscosity adjustor, a drying condition at a time of making into a stage B, and an added amount of a low-molecular component having a flowability and so on in the thermosetting resin composition as above, the thermal time viscosity of the adhesive can be made to be in the range of 500 to 5000 Pa·s. A flowing viscosity of the adhesive at a time of heat curing, which will be described later, can be adjusted in a desired range by adjusting an added amount or the like of the accelerator in the thermosetting resin composition, in addition to by the above-described adjustment of the components and adjustment of the condition. The adhesive layer 7 is made of a cured product of such an adhesive.

By using the adhesive containing the thermosetting resin whose thermal time viscosity is in the range of 500 to 5000 Pa·s, an embedding capability of the second semiconductor chip 10 in the adhesive layer can be heightened. It becomes possible to suppress occurrence of a failure due to insufficient embedding of the second semiconductor chip 10. The adhesive layer 7 is formed by curing the thermosetting resin whose thermal time viscosity is in the range of 500 to 5000 Pa·s. Therefore, according to an adhesive layer 7 which contains a curing product of a thermosetting resin whose thermal time viscosity is in the range of 500 to 5000 Pa·s, it is possible to provide a semiconductor device 1 in which occurrence of a failure due to insufficient embedding of a second semiconductor chip 10 in the adhesive layer 7, that is, occurrence of a deformation of a first semiconductor chip 6 or a void of the adhesive layer 7 is suppressed.

In a case where a thick adhesive layer 7 with a thickness of 95 μM or more is applied, a warpage amount of a semiconductor device 1 is apt to increase when the semiconductor device 1 is heated from a room temperature (25° C.) to a second mounting temperature (for example, 270° C.). In the semiconductor device 1 of this embodiment, a thickness of the sealing resin layer 13 on the first semiconductor chip 6 (more specifically, the first semiconductor chip 6D positioned at the highest) is 190 μm or more. As a result that the thickness of the sealing resin layer 13 on the first semiconductor chip 6 is 190 μm or more, a warpage of the semiconductor device 1 at a time of heating can be suppressed. Since the warpage of the semiconductor device 1 at the time of heating increases when a thickness of the sealing resin layer 13 is too large, the thickness of the sealing resin layer 13 on the first semiconductor chip 6 is 440 μm or less.

Figure 4A:
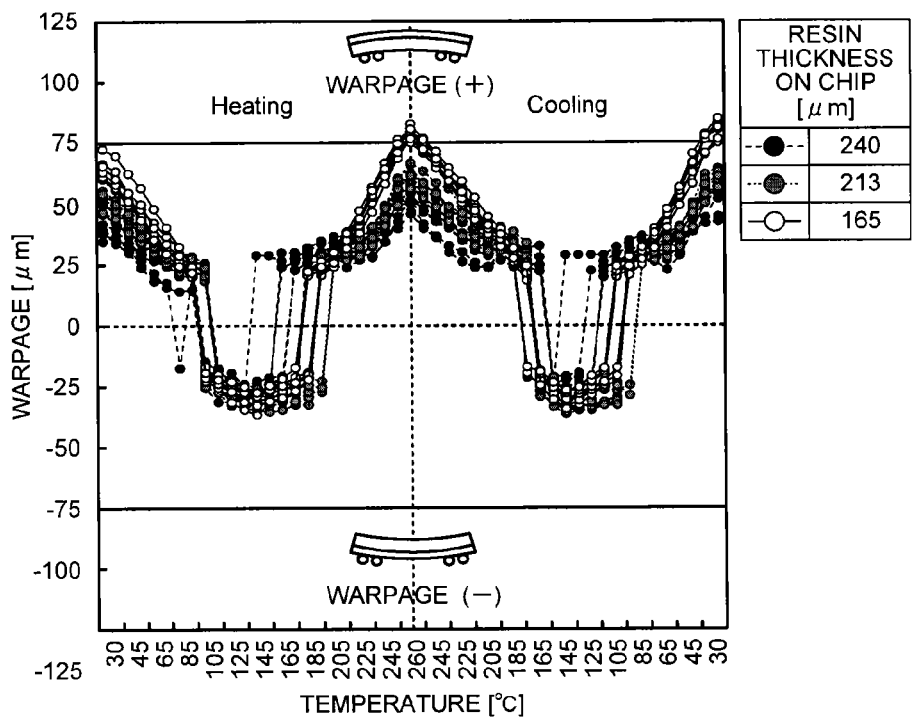
FIG. 4A and FIG. 4B are graphs showing relations between a temperature and a warpage amount of the semiconductor device according to the embodiment based on a thickness of a sealing resin layer on a first semiconductor chip.
Figure 4B:
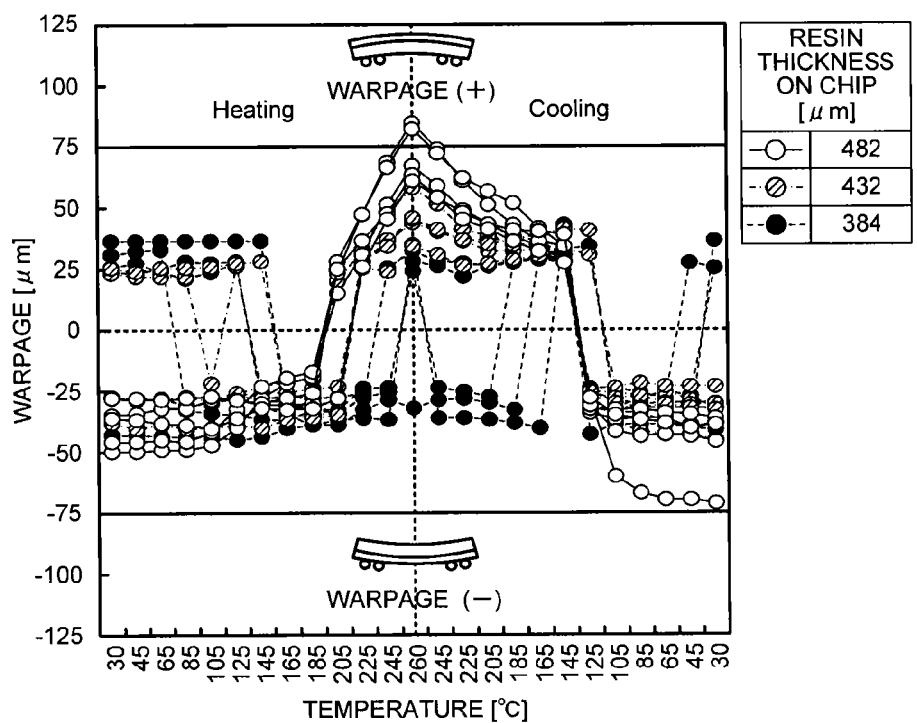

FIG. 4A and FIG. 4B show relations between temperatures and warpage amounts of the semiconductor devices 1 based on the thicknesses of the sealing resin layer 13 on the first semiconductor chip 1. The warpage amounts of the semiconductor device 1 are results measured in accordance with "Method for measuring a warpage of a package due to heating and maximum tolerance (ED-7306)" by a JEITA standard. A size of the semiconductor device 1 is 12 mm×17 mm. The thickness of the sealing resin layer 13 on the first semiconductor chip 6 is defined as a thickness obtained by subtracting a thickness of the first adhesive layer 7, thicknesses of the first semiconductor chips 6A to 6D, and thicknesses of the second adhesive layers 8A to 8C from a whole thickness of the sealing resin layer 13. As shown in FIG. 4A and FIG. 4B, when the thickness of the adhesive layer 7 in which the second semiconductor chip 10 is embedded is in a range of 95 to 150 μm, by making the thickness of the sealing resin layer 13 on the first semiconductor chip 6 be in a range of 190 to 440 μm, the warpage amount of the semiconductor device 1 can be made equal to or less than an allowable range (equal to or less than 70 μm). It is preferable that the thickness of the sealing resin layer 13 on the first semiconductor chip 6 is in a range of 200 to 420 μm, and further, it is more preferable that the thickness of the sealing resin layer 13 on the first semiconductor chip 6 is in a range of 230 to 400 μm.

The warpage amount of the semiconductor 1 at the time of heating is also influenced by a thickness or a property of the wiring board 2 and a whole thickness or a property of the sealing resin layer 13. In view of these points, it is preferable that the thickness of the wiring board 2 is in a range of 100 to 160 μm. It is preferable that the whole thickness of the sealing resin layer 13 is, though depending on the mounted number of the first semiconductor chips 6, in a range of 750 to 810 μm. Further, when a thermal expansion coefficient of the adhesive layer 7 is in a range of 70 to 470 ppm/° C. and a room temperature modulus of elasticity (after curing) is in a range of 2 to 3 GPa, it is preferable that a thermal expansion coefficient of a core material of the wiring board 2 is in a range of 8 to 10 ppm/° C. and a room temperature modulus of elasticity is in a range of 30 to 40 GPa, and it is preferable that a thermal expansion coefficient of the sealing resin layer 13 is in a range of 8 to 10 ppm/° C. and that a room temperature modulus of elasticity (after curing) is in a range of 1 to 30 GPa. Thereby, a warpage of the semiconductor device at the time of heating is suppressed reproducibly.

Figure 5A:
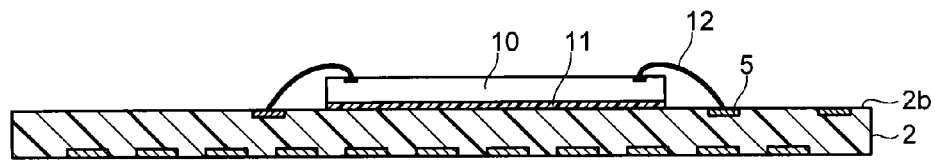
FIG. 5A to FIG. 5D are cross-sectional views showing a method for manufacturing the semiconductor device shown in FIG. 1.
Figure 5B:
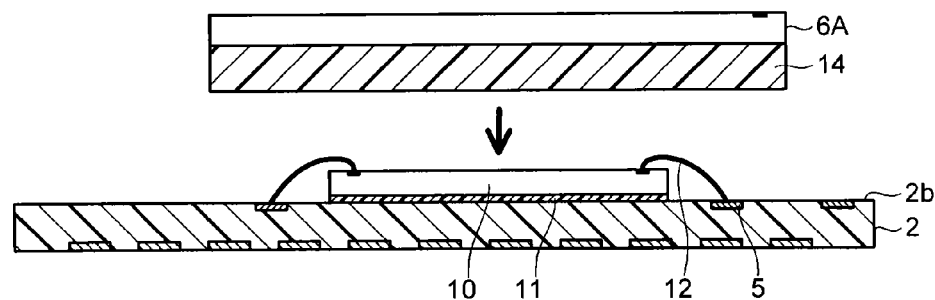

The semiconductor device 1 of the embodiment is fabricated, for example, as follows. A manufacturing process of the semiconductor 1 will be described with reference to FIG. 5A to FIG. 5D. As shown in FIG. 5A, a second semiconductor chip 10 is bonded on a second surface 2b of a wiring board 2 via an adhesive layer 11. Wire bonding is performed to a second semiconductor chip 10, and an internal electrode 5 of the wiring board 2 and an electrode pad of the second semiconductor chip 10 are electrically connected via a second bonding wire 12. As shown in FIG. 5B, a first semiconductor chip 6A having an adhesive layer 14 formed on a rear surface (non-circuit surface) thereof is prepared. The adhesive layer 14 is made by forming an adhesive including a thermosetting resin whose thermal time viscosity is in a range of 500 to 5000 Pa·s into a layer, and is in a half-cured state. A method for forming the adhesive layer 14 will be described later.

Figure 5C:
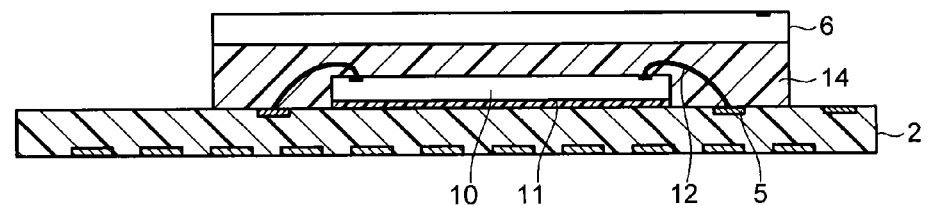

Though illustration is omitted in FIG. 5B, the circuit board 2 is mounted on a stage, and the first semiconductor chip 6A is held, for example, by a suction head. The first semiconductor chip 6A and the adhesive layer 14 are heated to a predetermined temperature, for example, by a heating mechanism housed in the suction head. The circuit board 2 is also heated by a heating mechanism housed in the stage as necessary. The adhesive layer 14 softened or melted by heating is pressed to a second surface 2b of the circuit board 2. The adhesive layer 14 is pressure-bonded to the circuit board 2 in a manner to incorporate the second semiconductor chip 10. As shown in FIG. 5C, the second semiconductor chip 10 is embedded in the adhesive layer 14. Since a thermal time viscosity of the adhesive constituting the adhesive layer 14 is in a range of 500 to 5000 Pa·s, the second semiconductor chip 10 can be satisfactorily embedded in the adhesive layer 14.

Figure 5D:
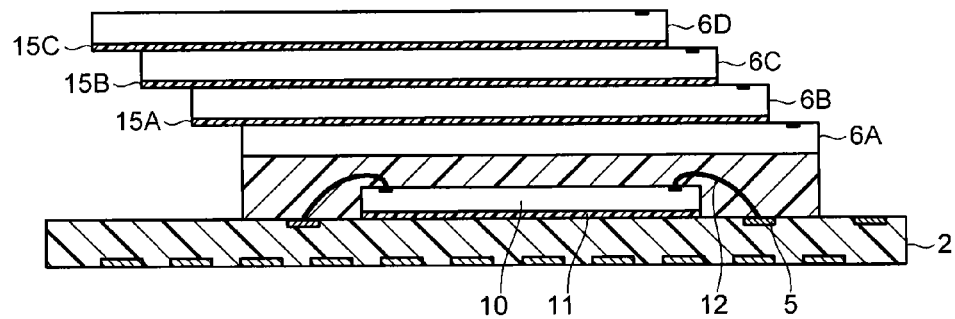

Next, as shown in FIG. 5D, first semiconductor chips 6B to 6D are stacked in sequence on the first semiconductor chip 6A. The first semiconductor chips 6B to 6D having normal thicknesses (for example, about 55 μm) are stacked in sequence via adhesive layers (die attach films (DAF)) or die attach pastes (DAP)) 15A to 15C. Thereafter, in order that the adhesive layers 14, 15A to 15C have sufficient hardnesses, the adhesive layers 14, 15A to 15C are subjected to cure processings. In the cure processings of the adhesive layers 14, 15A to 15C using thermosetting resins, the adhesives are once softened or melted to exhibit flowability and, thereafter, curing reactions proceed, and thereby, the adhesive layers 7, 8A to 8C made of the thermosetting resins having predetermined hardnesses are obtained.

When flowing viscosities at a time of the curing processings of the adhesive layers 14, 15A to 15C, that is, viscosities at a time of being softened or melted to exhibit flowability, are too low, a deformation amount of the adhesive layer 14 is increased, leading to an increase of a warpage amount of the first semiconductor chip 6. A warpage of the first semiconductor chip 6 causes occurrence of an operation failure, similarly to the aforementioned convex shape deformation. In this embodiment, an adhesive whose flowing viscosity at a time of a curing processing is 1000 Pa·s or more is applied to the adhesive layer 14. When a flowing viscosity in a curing processing of an adhesive is 1000 Pa·s or more, it is possible to suppress not only a deformation of the adhesive layer 14 but also a warpage of the first semiconductor chip 6. A temperature zone where an adhesive exhibits flowability at a time of curing processing is a range, for example, of 60 to 120° C.

Thereafter, wire bonding is performed to the first semiconductor chips 6A to 6D, and the internal electrode 5 of the wiring board 2 and electrode pads of the first semiconductor chips 6A to 6D are electrically connected via a first bonding wire 9. Further, by forming a sealing resin layer 13 to seal the semiconductor chips 6, 10 together with the bonding wires 9, 12 on the second surface 2b of the wiring board 2, the semiconductor device 1 of the embodiment is fabricated. In performing wire bonding to the first semiconductor chips 6A to 6D, if a room temperature modulus of elasticity (after curing) of the first adhesive layer 7 with the large thickness is too low, connectivity of the bonding wire 9 to the first semiconductor chip 6A is reduced. Thus, it is preferable that a modulus of elasticity after curing of the first adhesive layer 7 is 20 MPa or more.

At the time of wire bonding, since heat is also applied generally, it is preferable that a modulus of elasticity after curing of the first adhesive layer is a thermal time modulus of elasticity at a temperature of a soldering time, for example, at 220 to 260° C. As a result that the thermal time modulus of elasticity of the first adhesive layer 7 is 20 MPa or more, wire bonding capability to the first semiconductor chip 6 can be heightened. The thermal time modulus of elasticity of the first adhesive layer 7 can be made to 20 MPa or more by, for example, adjusting contents of inorganic filler in the thermosetting resin composition described above.

Figure 6A:
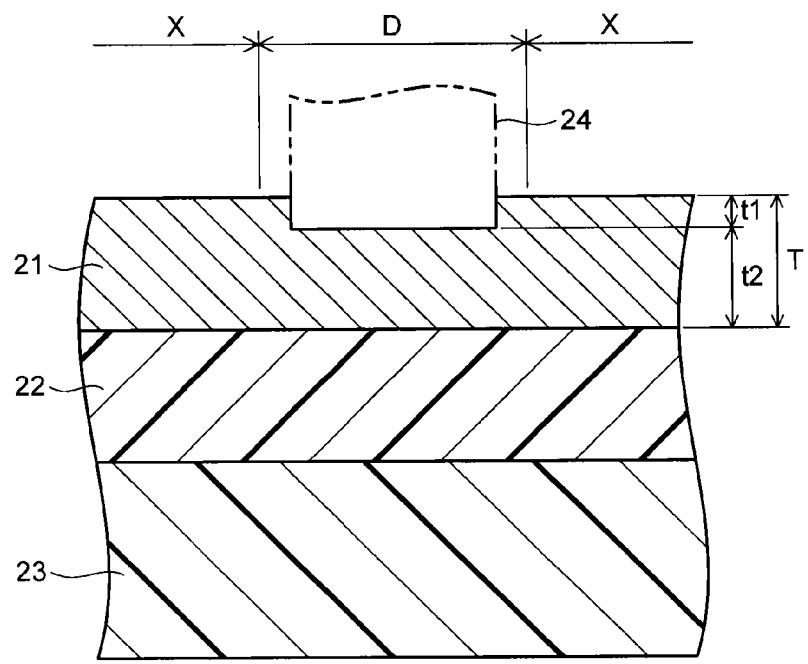
FIG. 6A and FIG. 6B are cross-sectional views showing a fabrication process of a first semiconductor chip used in the method for manufacturing the semiconductor device shown in FIG. 5A to FIG. 5D.
Figure 6B:
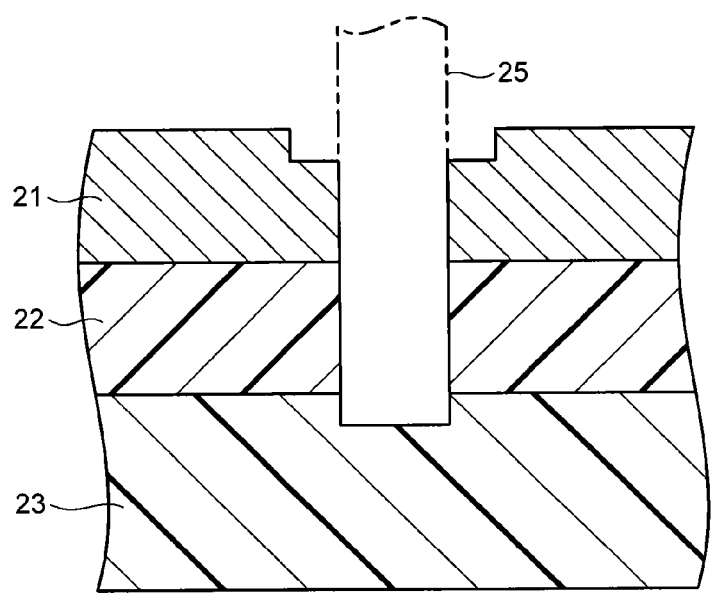

Next, a fabrication process of a first semiconductor chip 6 having an adhesive layer 14 will be described with reference to FIG. 6A and FIG. 6B. As shown in FIG. 6A, a semiconductor wafer 21 having a plurality of element regions X equivalent to the first semiconductor chip 6 is prepared. To a rear surface (non-circuit surface) of the semiconductor wafer 21, an adhesive sheet (die attach film) in a half-cured state is attached or an adhesive resin (die attach paste) in a liquid state is applied by an ink-jet method or a dispense method and thereafter half-cured, so that an adhesive layer 22 of a wafer which becomes an adhesive layer 14 after segmentation is formed. A dicing tape 23 is attached to the adhesive layer 22. In other words, the adhesive layer 22 and the dicing tape 23 are laminated in sequence on the rear surface of the semiconductor wafer 21.

The semiconductor wafer 21 is cut together with the adhesive layer 22 along a dicing region D provided between the element regions X, and the first semiconductor chip 6 having the adhesive layer 14 which is segmented is fabricated. Cutting of the semiconductor wafer 21 is performed by using, for example, a blade dicing device of a biaxial structure, that is, a blade dicing device configured that two blades mounted on two rotary axes proceed on the same trajectory. A preceding first blade 24 cuts only a part of a thickness T of the semiconductor wafer 21, and a second blade 25 of the rear cuts a thickness of a remaining part of the semiconductor wafer 21 and the whole thickness of the adhesive layer 22.

As shown in FIG. 6A, only a part of the thickness T of the semiconductor wafer 21 is cut by the first blade 24. In other words, the first blade 24 cuts only a thickness t1 of the semiconductor wafer 21. In a cutting process by the first blade 24, the semiconductor wafer 21 is not completely cut, but a part thereof (thickness t2 part) remains in an uncut state. Next, as shown in FIG. 6B, by the second blade 25, the thickness t2 of the remaining part of the semiconductor wafer 21 and the whole thickness of the adhesive layer 22 are cut together with a part of the dicing tape 23. For the second blade 25, a blade whose blade width is narrower than that of the first blade 24 is used.

As a result that only the thickness t1 of a part of the semiconductor wafer 21 is cut by the first blade 24 and that the thickness t2 of the remaining part of the semiconductor wafer 21 is cut together with the adhesive layer 22 by the second blade 25 with the narrower blade width, the semiconductor wafer 21 is cut together with the adhesive layer 22 and segmented. By applying such a cutting process (step cut), a level difference occurs in a cross-section of the semiconductor wafer 21 as shown in FIG. 6B. Thereby, occurrence of chipping is suppressed. However, if a cut amount of the semiconductor wafer 21 by the second blade 25 is insufficient, there is an apprehension that a cutting capability of the thick adhesive layer 22 whose thickness is in a range of 95 to 150 µm is reduced. If cutting of the adhesive layer 22 is insufficient, a failure occurs when the semiconductor chip after segmentation is picked up from the dicing tape 23. It is considered that this is because cutting dust of the adhesive layer 22 which attaches at a time of cutting remains too much on the second blade 25 since an abrasion amount of the second blade 25 is small.

Thus, in the embodiment, the thickness t2 cut by the second blade 25 of the semiconductor wafer 21, in other words, the thickness t2 of the remaining part of the semiconductor 21 after being cut by the first blade 24 is 85 µm or more. As a result that the cut amount of the semiconductor wafer 21 by the second blade 25 is made to 85 µm or more, the second blade 25 is abraded appropriately by the semiconductor wafer 21, so that the cutting capability of the thick adhesive layer 22 with the thickness of 95 to 150 µm can be heightened. In order to cut the adhesive layer 22 made of a half-cured product of a thermosetting resin composition satisfactorily, it is preferable that the second blade 25 is be abraded appropriately by the semiconductor wafer 21. As a result that the thickness t2 of the remaining part of the semiconductor wafer 21 is made to 85 µm or more, the abrasion amount of the second blade 25 becomes, for example, 0.3 µm/m or more, and the cutting capability of the adhesive layer 22 is improved.

Figure 7:
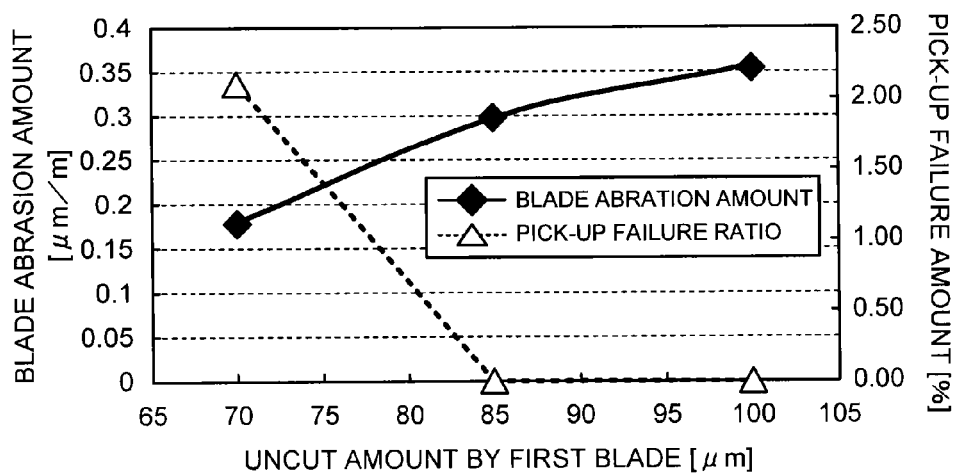
FIG. 7 is a graph showing a relation between a wafer uncut amount of a first blade and a blade abrasion amount and a relation between the wafer uncut amount of the first blade and a pickup defective ratio in the fabrication process of the first semiconductor chip shown in FIG. 6A and FIG. 6B.

FIG. 7 is a graph showing a relation among an uncut amount of the semiconductor wafer 21 by the first blade 24, a blade abrasion amount, and a pick-up failure ratio. By making the uncut amount (t2) of the semiconductor wafer 21 by the first blade 24 to 85 µm or more, the abrasion amount of the blade becomes 0.3 µm/m or more. Thereby, it is possible to prevent occurrence of a pick-up failure of the semiconductor chip 6 having the adhesive layer 14. Further, in order to obtain a suppression effect of chipping due to step cut, it is preferable that the cutting amount (t1) of the semiconductor wafer 21 by the first blade 24 is 5 µm or more. Thus, it is preferable that the thickness T of the semiconductor wafer 21 in which step cut is performed is 90 µm or more, it is more preferable that the thickness T is 100 µm or more when each tolerance or the like is considered, and it is further preferable that the thickness T is 110 µm or more.

Thereafter, the segmented first semiconductor chip 6 is picked up from the dicing tape by using a suction collet or the like. On the rear surface of the first semiconductor chip 6 is formed the segmented adhesive layer 14. Since the adhesive layer 22 can be surely segmented by the above-described step cut, it is possible to suppress the occurrence of the pick-up failure based on the cutting failure of the adhesive layer 22. Further, by applying step cut, it is possible to suppress occurrence of chipping. In other words, it is possible to suppress occurrence of a pick-up failure of the first semiconductor chip 6 while suppressing occurrence of chipping. The first semiconductor chip 6 having the adhesive layer 14 is used in a bonding process of the semiconductor chip 6 shown in FIG. 5B, and is bonded to the circuit board 2 while embedding the second semiconductor chip 10 in the adhesive layer 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device, comprising:
a circuit board including a core material having a thermal expansion coefficient in a range of 8 to 10 ppm/° C. and a room temperature modulus of elasticity in a range of 30 to 40 GPa;
a first semiconductor chip disposed on the circuit board;
an adhesive layer fixing the first semiconductor chip to the circuit board and having a thickness in a range of 95 to 150 µm, a thermal expansion coefficient in a range of 70 to 470 ppm/° C., and a room temperature modulus of elasticity in a range of 2 to 3 GPa;
a second semiconductor chip, at least a part of which is embedded in the adhesive layer, having an outer shape smaller than that of the first semiconductor chip;
a first connecting member electrically connecting the circuit board and the first semiconductor chip;
a second connecting member electrically connecting the circuit board and the second semiconductor chip; and
a sealing resin layer provided on the circuit board to seal the first and second semiconductor chips with the first and second connecting members,
wherein a thickness of the sealing resin layer on the first semiconductor chip is in a range of 190 to 440 µm.
2. The semiconductor device according to claim 1,
wherein the second semiconductor chip has a thickness of 75 µm or less.
3. The semiconductor device according to claim 1,
wherein the first semiconductor chip has a thickness of 90 µm or more.
4. The semiconductor device according to claim 1,
wherein the first semiconductor chip comprises a plurality of semiconductor chips, and the plurality of semiconductor chips are stacked.
5. The semiconductor device according to claim 1,
wherein the second semiconductor chip is bonded to the circuit board via an adhesive layer.
6. The semiconductor device according to claim 1,
wherein the circuit board has a thickness in a range of 100 to 160 µm.
7. The semiconductor device according to claim 1,
wherein the sealing resin layer has a thermal expansion coefficient in a range of 8 to 10 ppm/° C. and a room temperature modulus of elasticity in a range of 1 to 30 GPa.

8. A method for manufacturing a semiconductor device, comprising:
- preparing a circuit board;
- preparing a first semiconductor chip;
- preparing a second semiconductor chip having an outer shape smaller than that of the first semiconductor chip and a thickness of 75 μm or less;
- mounting the second semiconductor chip on the circuit board;
- electrically connecting the circuit board and the second semiconductor chip via a first connecting member;
- fixing the first semiconductor chip on the circuit board with an adhesive, while embedding at least a part of the second semiconductor chip in the adhesive;
- electrically connecting the circuit board and the first semiconductor chip via a second connecting member; and
- forming a sealing resin layer sealing the first and second semiconductor chips with the first and second connecting members, on the circuit board,
- wherein the adhesive includes a thermosetting resin whose thermal time viscosity at a time that the second semiconductor chip is embedded is in a range equal of 500 to 5000 Pa·s or more,
- wherein the preparing of the first semiconductor chip comprises:
- laminating a layer of the adhesive and a dicing tape in sequence on a rear surface of a semiconductor wafer;
- cutting only a part of a thickness of the semiconductor wafer by using a first blade;
- cutting a thickness of a remaining part of the semiconductor wafer and a whole thickness of the layer of the adhesive by using a second blade whose blade width is narrower than that of the first blade, to form the first semiconductor chip having the layer of the adhesive; and
- picking up the first semiconductor chip having the layer of the adhesive from the dicing tape, and
- wherein the thickness of the remaining part of the semiconductor wafer after being cut by the first blade is 85 μm or more.

9. The manufacturing method according to claim 8,
- wherein the first semiconductor chip is fixed to the circuit board with an adhesive layer containing a curing product of the thermosetting resin, and
- wherein the adhesive layer has a thickness in a range of 95 to 150 μm.

10. The manufacturing method according to claim 8,
- wherein the adhesive is cured after the second semiconductor chip is embedded, and
- wherein a flowing viscosity of the adhesive at a time of curing is 1000 Pa·s or more.

11. The manufacturing method according to claim 8,
- wherein a thickness of the sealing resin layer on the first semiconductor chip is in a range of 190 to 440 μm.

12. The manufacturing method according to claim 8,
- wherein the mounting of the second semiconductor chip comprises bonding the second semiconductor chip to the circuit board, and
- wherein the fixing of the first semiconductor chip comprises:
- heating the adhesive so that the adhesive has the thermal time viscosity;
- press-fixing the heated adhesive to the circuit board, at least a part of the second semiconductor chip being disposed in the heated adhesive; and
- curing the adhesive.

13. The manufacturing method according to claim 8,
- wherein the semiconductor wafer has a thickness of 90 μm or more, and
- wherein a cut amount of the semiconductor wafer by the first blade is 5 μm or more.

* * * * *